United States Patent
Kon et al.

(10) Patent No.: US 7,921,147 B2
(45) Date of Patent: Apr. 5, 2011

(54) FILTERING INTEGRATED CIRCUIT

(75) Inventors: Yoshihiko Kon, Ashikaga (JP);
Kazuhiro Kimura, Fukaya (JP);
Takahiro Takeda, Kawaguchi (JP)

(73) Assignees: Sanyo Electric Co., Ltd., Osaka (JP);
Sanyo Semiconductor Co., Ltd.,
Gunma (JP)

(*) Notice: Subject to any disclaimer, the term of this patent is extended or adjusted under 35 U.S.C. 154(b) by 936 days.

(21) Appl. No.: 11/776,435

(22) Filed: Jul. 11, 2007

(65) Prior Publication Data
US 2008/0016136 A1    Jan. 17, 2008

(30) Foreign Application Priority Data
Jul. 13, 2006    (JP) .................. 2006-192872

(51) Int. Cl.
*G06F 17/10* (2006.01)
(52) U.S. Cl. .................. 708/319; 708/320
(58) Field of Classification Search .............. 708/319, 708/320
See application file for complete search history.

(56) References Cited

U.S. PATENT DOCUMENTS

| | | | | |
|---|---|---|---|---|
| 4,467,440 A | * | 8/1984 | Sano et al. | 708/320 |
| 5,029,121 A | * | 7/1991 | Kawata et al. | 708/319 |
| 5,355,329 A | * | 10/1994 | Lyon | 708/320 |
| 5,530,660 A | * | 6/1996 | Sun et al. | 708/300 |
| 6,446,103 B2 | | 9/2002 | Schollhorn | |
| 6,581,080 B1 | * | 6/2003 | Richards | 708/320 |
| 7,565,389 B2 | * | 7/2009 | Runze | 708/319 |

FOREIGN PATENT DOCUMENTS
JP   2002-058153   2/2002
KR   2000-0020491   4/2000

OTHER PUBLICATIONS

Korean Intellectual Property Office, Office Action for Application No. 10-2007-70039. Mail date of Aug. 26, 2008.

* cited by examiner

*Primary Examiner* — Chuong D Ngo
(74) *Attorney, Agent, or Firm* — SoCal IP Law Group LLP; Steven C. Sereboff; John E. Gunther

(57) ABSTRACT

A filtering integrated circuit comprises: a storing circuit; a filter coefficient calculating unit configured to receive frequency information that identifies a characteristic frequency of an output signal in a filtering process, and to set filter coefficients calculated based on the frequency information in the storing circuit; and a filtering unit configured to output the output signal after applying a filtering process to an inputted signal based on the filter coefficients set in the storing circuit.

6 Claims, 14 Drawing Sheets

| FILTER TYPE (1Byte) | FREQUENCY INFORMATION (2Byte) | SELECTIVITY INFORMATION (1Byte) | GAIN INFORMATION (1Byte) |

FILTERING INTEGRATED CIRCUIT

CROSS-REFERENCE TO RELATED APPLICATION

This application claims the benefit of priority to Japanese Patent Application No. 2006-192872, filed Jul. 13, 2006, of which full contents are incorporated herein by reference.

BACKGROUND OF THE INVENTION

1. Field of the Invention

The present invention relates to a filtering integrated circuit.

2. Description of the Related Art

A filtering process aiming at removing noises etc. is executed in, for example, a signal processing circuit used in an AM radio receiving apparatus, an FM radio receiving apparatus, etc. FIG. 15 is a diagram of a portion of a system configured using a signal processing circuit. A signal processing circuit 100 is an integrated circuit that has a DSP (Digital Signal Processor) therein. For example, when the signal processing circuit 100 is used in an AM radio receiving apparatus, a DSP 110 executes a filtering process that aims at removing noises, equalizing, etc. to a digital signal inputted thereto. The characteristic of the filtering in the DSP 110 is determined based on filter coefficients stored in a register 120 inside the DSP 110. That is, the filter characteristic can be changed by changing the filter coefficients stored in the register 120.

Changing the filter coefficients from a microcomputer 130 outside the signal processing circuit 100 is common as a method of changing the filter coefficients stored in the register 120 (see, for example, Japanese Patent Application Laid-Open Publication No. 2002-058153). The microcomputer 130 calculates filter coefficients based on a cut-off frequency, a center frequency, a selectivity Q, etc. that are to determine a desired filter characteristic, and stores the calculated filter coefficients into a memory 140. Thereafter, the microcomputer 130 transmits the filter coefficients stored in the memory 140 through a system bus etc. to the signal processing circuit 100. The filter coefficients transmitted to the signal processing circuit 100 are stored in the register 120 and, thereby, the filter characteristic is changed.

For example, the case where the filtering in the DSP 110 is realized by a 2nd-order IIR filter is considered. FIG. 16 is a block diagram of an exemplary concept of a 2nd-order IIR filter. As shown in FIG. 16, a 2nd-order IIR filter can be configured by delaying units 150 to 153, an adding unit 154, and multiplying units 155 to 159.

The multiplying units 155 to 159 multiply a signal inputted thereto by coefficients A[0] to B[2], respectively, and output the multiplication results. Assuming that the number of bits (the precision) of each of the coefficients A[0] to B[2] stored in the register 120 is, for example, 24 bits (three bytes), the storage capacity necessary to store the coefficients A[0] to B[2] is 120 bits (15 bytes). The storage capacity necessary to store the filter coefficients increases as the order of the IIR filter or the precision of the filter coefficients becomes higher. That is, in the microcomputer 130 that calculates the filter coefficients, the capacity of the memory 140 needs to be increased to store the calculated filter coefficients. Because the filter coefficients stored in the memory 140 need to be transmitted to the signal processing circuit 100, the communication traffic in the system bus, etc. is increased and this may influence the processing performance of the system.

SUMMARY OF THE INVENTION

The present invention has been made considering the above problem and is directed to providing a filtering integrated circuit for which the data amount of controlling data inputted to change the filter characteristic is less than the data amount of filter coefficients.

In order to solve the above problems, according to a major aspect of the present invention there is provided a filtering integrated circuit comprising: a storing circuit; a filter coefficient calculating unit configured to receive frequency information that identifies a characteristic frequency of an output signal in a filtering process, and to set filter coefficients calculated based on the frequency information in the storing circuit; and a filtering unit configured to output the output signal after applying a filtering process to an inputted signal based on the filter coefficients set in the storing circuit.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Circuit Configuration

Figures 1, 2:
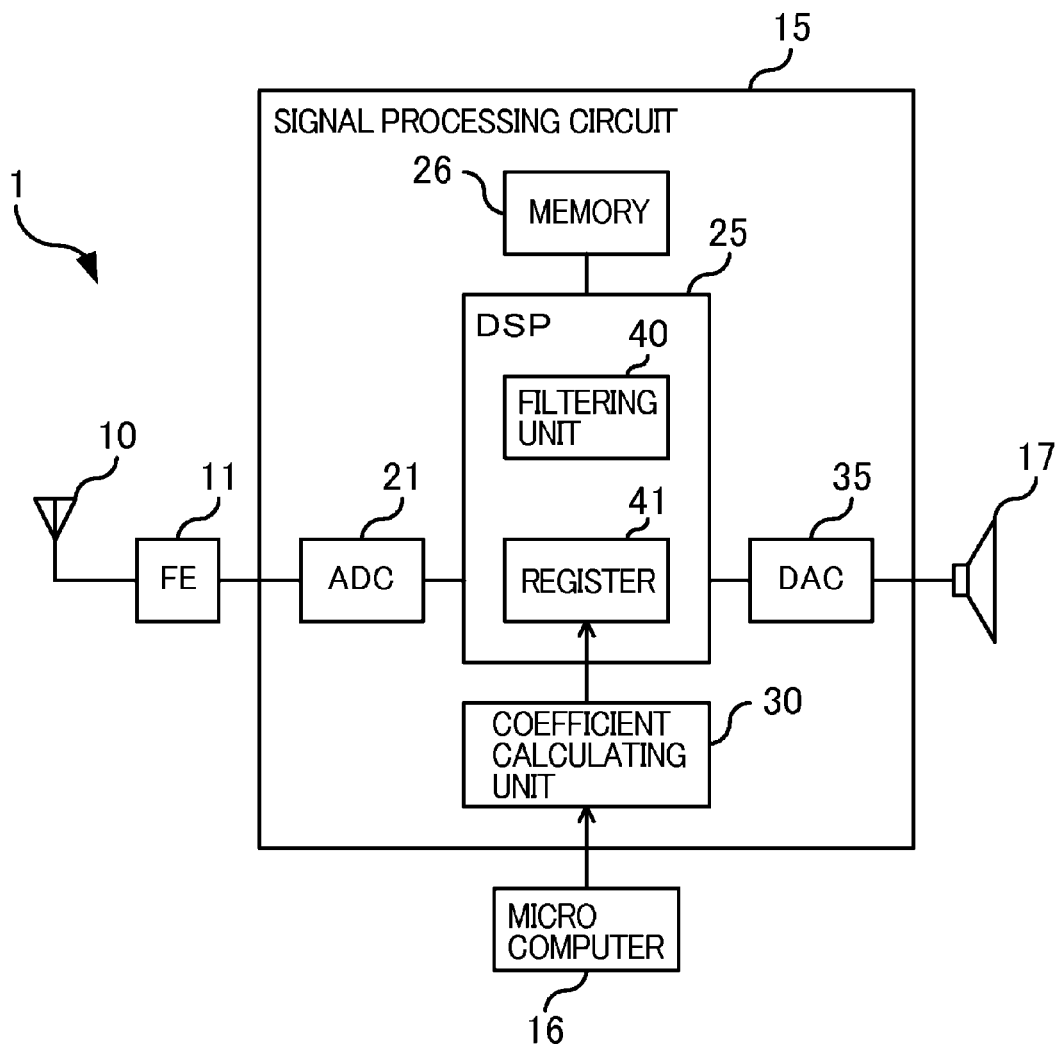
FIG. 1 is a diagram of an exemplary configuration of an AM radio receiving apparatus that is configured including a signal processing circuit that is an embodiment of a filtering integrated circuit of the present invention.
FIG. 2 is a diagram of exemplary controlling data transmitted from a microcomputer to a coefficient calculating unit.

FIG. 1 is a diagram of an exemplary configuration of an AM radio receiving apparatus that is configured including a signal processing circuit that is an embodiment of a filtering integrated circuit of the present invention. An AM radio receiving apparatus 1 is configured including an antenna 10, a front-end processing circuit (FE) 11, a signal processing circuit 15, a microcomputer 16, and a speaker 17.

The front-end processing circuit 11 extracts a signal of a desired station to be received, from high frequency signals received through the antenna 10, and outputs an intermediate frequency signal of which the frequency is converted into a predetermined frequency (the intermediate frequency).

The signal processing circuit 15 is an integrated circuit that applies various processes to the intermediate frequency signal outputted from the front-end processing circuit 11, outputs a sound signal to the speaker 17, and is configured including an AD converter (ADC) 21, a DSP (Digital Signal Processor) 25, a memory 26, a coefficient calculating unit 30 (filter coefficient calculating unit), and a DA converter (DAC) 35.

The AD converter 21 converts the intermediate frequency signal outputted from the front-end circuit 11 into a digital signal and outputs the digital signal to the DSP 25.

The DSP 25 is a processor that can execute various processes to the digital signal such as a filtering process aiming at removing noises, equalizing, etc. and a decoding process of a coded signal. The DSP 25 is configured including a filtering unit 40 that executes a filtering process and a register 41 (storing circuit) that is used for various controls in the DSP 25. The filtering unit 40 is realized by execution by the DSP 25 of a program stored in the memory 26 such as a ROM (Read Only Memory), a RAM (Random Access Memory), and a flash memory. The memory 26 may be provided inside the DSP 25.

The coefficient calculating unit 30 receives controlling data to determine a filter characteristic such as a cut-off frequency and the center frequency from a microcomputer 16 provided outside the signal processing circuit 15, and calculates filter coefficients based on the received data. The coefficient calculating unit 30 stores the calculated filter coefficients through an internal bus, etc. of the signal processing circuit 15 into the register 41 inside the DSP 25. The coefficient calculating unit 30 can be realized by, for example, a microcomputer etc. The DSP 25 may have the function of the coefficient calculating unit 30.

The microcomputer 16 executes various controls to the signal processing circuit 15. In the embodiment, to determine the characteristic of the filtering process in the signal processing circuit 15, the controlling data such as the cut-off frequency and the center frequency is transmitted through a system bus etc. to the coefficient calculating unit 30 of the signal processing circuit 15.

FIG. 2 is a diagram of exemplary controlling data transmitted from the microcomputer 16 to a coefficient calculating unit 30. The controlling data is configured including filter type information, frequency information, selectivity information, and gain information.

The filter type information is information to identify the type of a filter such as a low-pass filter, a high-pass filter, and a band-pass filter. In the embodiment, the data length of the filter type information is one byte and, for example, eight types, 0x00 to 0x07 of filter types can be designated therein. When the filter type information is one byte, up to 256 types (0x00 to 0xFF) of filter types, for example, may be designated.

The frequency information is information to identify the characteristic frequency of a filtering process. The characteristic frequency refers to a frequency that identifies a frequency characteristic of an output signal of a filtering process such as a cut-off frequency for a low-pass filter or a low-shelf filter, or a center frequency for a peaking filter or a band-pass filter. In the embodiment, the data length of the frequency information is two bytes and, for example, frequencies ranging from 20 Hz (0x0014) to 20,000 Hz (0x4E20) can be designated in hertz therein. When the frequency information is two bytes, for example, frequencies from 0 Hz (0x0000) to 65,535 Hz (0xFFFF) can be designated.

The selectivity information is information to identify a selectivity Q in a filtering process. In the embodiment, the data length of the selectivity information is one byte and, for example, an integer value obtained by multiplying by 10 the selectivity Q that can be taken every 0.1 from 0.4 to 10.0 is set therein. That is, a value ranging from 4 (0x04) to 100 (0x64) is set in the selectivity information. An integer value obtained by multiplying the selectivity Q that can be taken every 0.1 is set in the selectivity information of one byte, a selectivity Q ranging, for example, 0.0 (0x00) to 25.5 (0xFF) can be designated.

The gain information is information to identify the gain of an output signal of a filtering process. In the embodiment, the data length of the gain information is one byte and, for example, an integer value obtained by doubling a gain value that can be taken every 0.5 from −20 dB to 20 dB is set. That is, a value ranging from −40 (0xD8) to 40 (0x28) is set in the gain information. When an integer value obtained by doubling a gain value that can be taken every 0.5 is set in the gain information of one byte, a gain ranging, for example, from −64 dB (0x80) to 63.5 dB (0x7F) can be designated.

Figure 3:
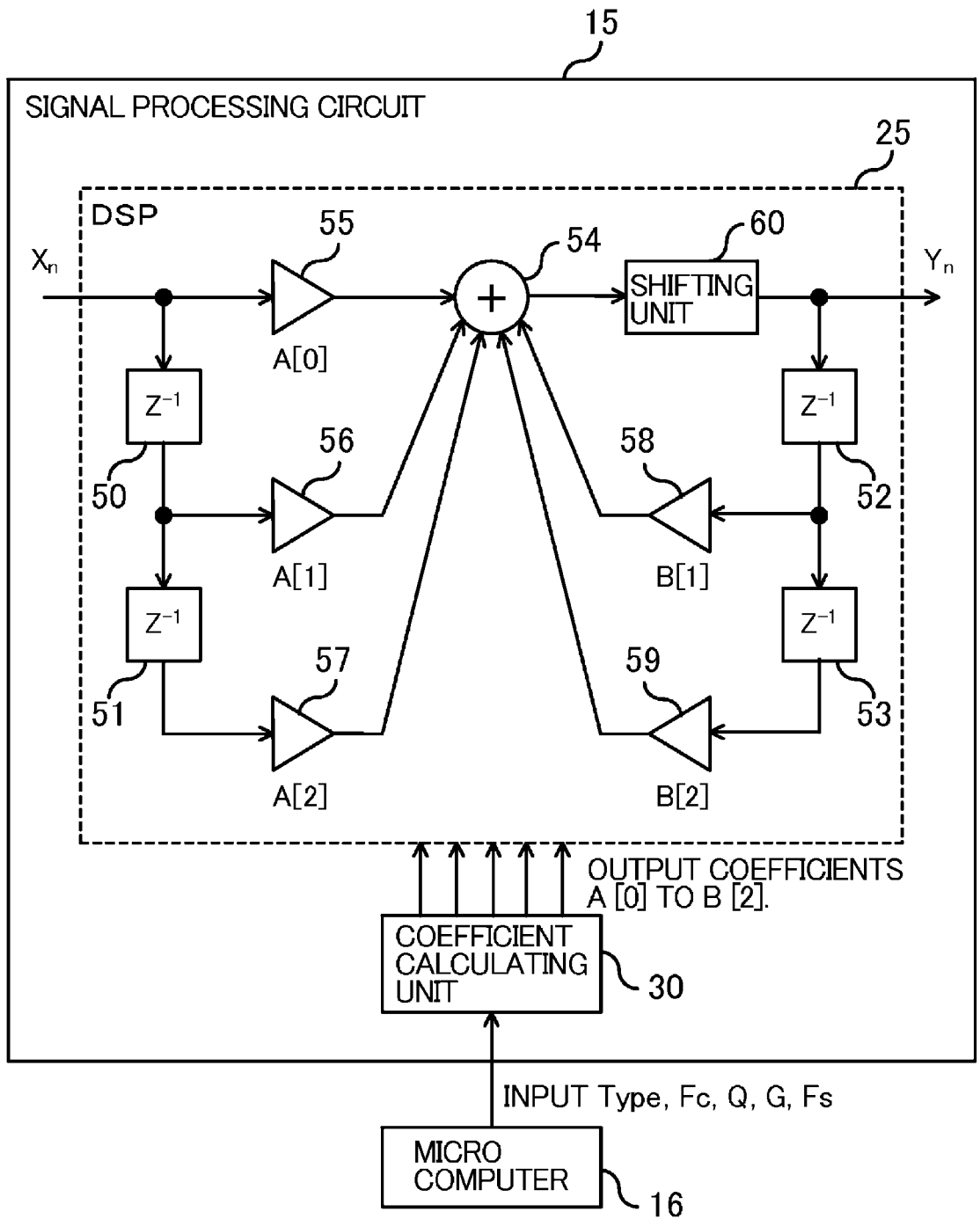
FIG. 3 is a block diagram of an exemplary concept of a 2nd-order IIR filter realized by a DSP.

FIG. 3 is a block diagram of an exemplary concept of a 2nd-order IIR filter realized by a DSP 25. As shown in FIG. 3, the 2nd-order IIR filter is configured by delaying units 50 to 53, an adding unit 54, multiplying units 55 to 59, and a shifting unit 60.

The microcomputer 16 outputs the filter type information (Type), the frequency information (Fc), the selectivity information (Q), the gain information (G), and sampling frequency information (Fs) through a system bus, etc. to the coefficient calculating unit 30 as the controlling data to determine the filter characteristic of the 2nd-order IIR filter. The sampling frequency information (Fs) is only outputted at the timing at which the sampling frequency needs to be changed.

The coefficient calculating unit 30 calculates the filter coefficients A[0] to B[2] in the 2nd-order IIR filter based on the controlling data inputted from the microcomputer 16, and stores the calculated filter coefficients into the register 41. The DSP 25 of the embodiment executes calculation of decimal fractions in the fixed point mode. Therefore, the coefficient calculating unit 30 outputs the filter coefficients after shifting the filter coefficients by a predetermined bits to the right to include the calculated filter coefficients A[0] to B[2] in −1 to 1. The filter unit 40 determines the amount to be shifted by in advance and may set the amount to be, for example, one bit or two bits.

Each of the delaying units 50 to 53 delays an inputted signal by one sampling time period and outputs the delayed signal. The adding unit 54 adds inputted signals and outputs the added signal. Multiplying units 55 to 59 multiply inputted signals by the filter coefficients A[0] to B[2] stored in the register 41, respectively, and output the multiplied signals.

The shifting unit 60 outputs an inputted signal after shifting the signal to the left by the same number of bits as that of the shift in the coefficient calculating unit 30. The shift to the left in the shifting unit 60 is to correct the amount that has been shifted by to the right in the coefficient calculating unit 30.

That is, the DSP 25 executes a filtering process based on the filter coefficients A[0] to B[2] calculated by the coefficient calculating unit 30. The filter characteristic of the DSP 25 can be varied by transmitting the controlling data such as the filter type information (Type) and the frequency information (Fc) from the microcomputer 16 to the signal processing circuit 15.

Coefficient Calculating Process

Figure 4:
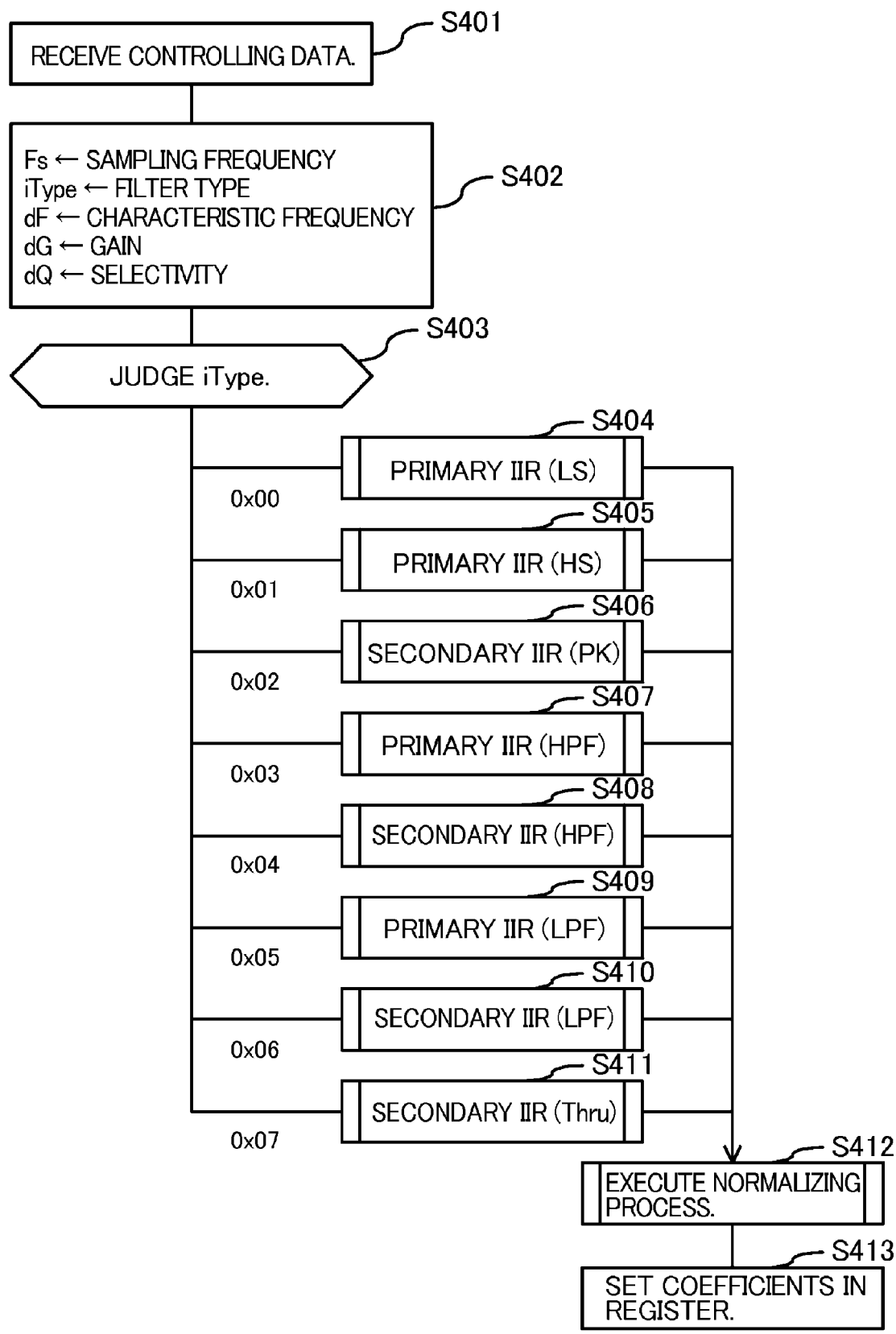
FIG. 4 is a flowchart of the entire flow of a coefficient calculating process.

Description will be given for a filter coefficient calculating process in the coefficient calculating unit 30. FIG. 4 is a flowchart of the entire flow of a coefficient calculating process. The coefficient calculating unit 30 receives the controlling data transmitted from the microcomputer 16 (S401), and sets the sampling frequency, the filter type, the characteristic frequency, the gain, and the selectivity to variables based on the piece of information included in the received controlling data (S402). The coefficient calculating unit 30 judges the filter type (iType) (S403) and executes a coefficient calculating process corresponding to the filter type (S404 to S411). The coefficient calculating unit 30 executes a normalizing process such that the calculated filter coefficients are in a range from −1 to 1 (S412), and sets the filter coefficients in the register 41 (S413).

Description will be given for the coefficient calculating process corresponding to the filter type. When the filter type (iType) is 0x00 (S403: 0x00), a coefficient calculating process to obtain a 1st-order IIR (primary IIR) low-shelf filter is executed (S404).

Figure 5:
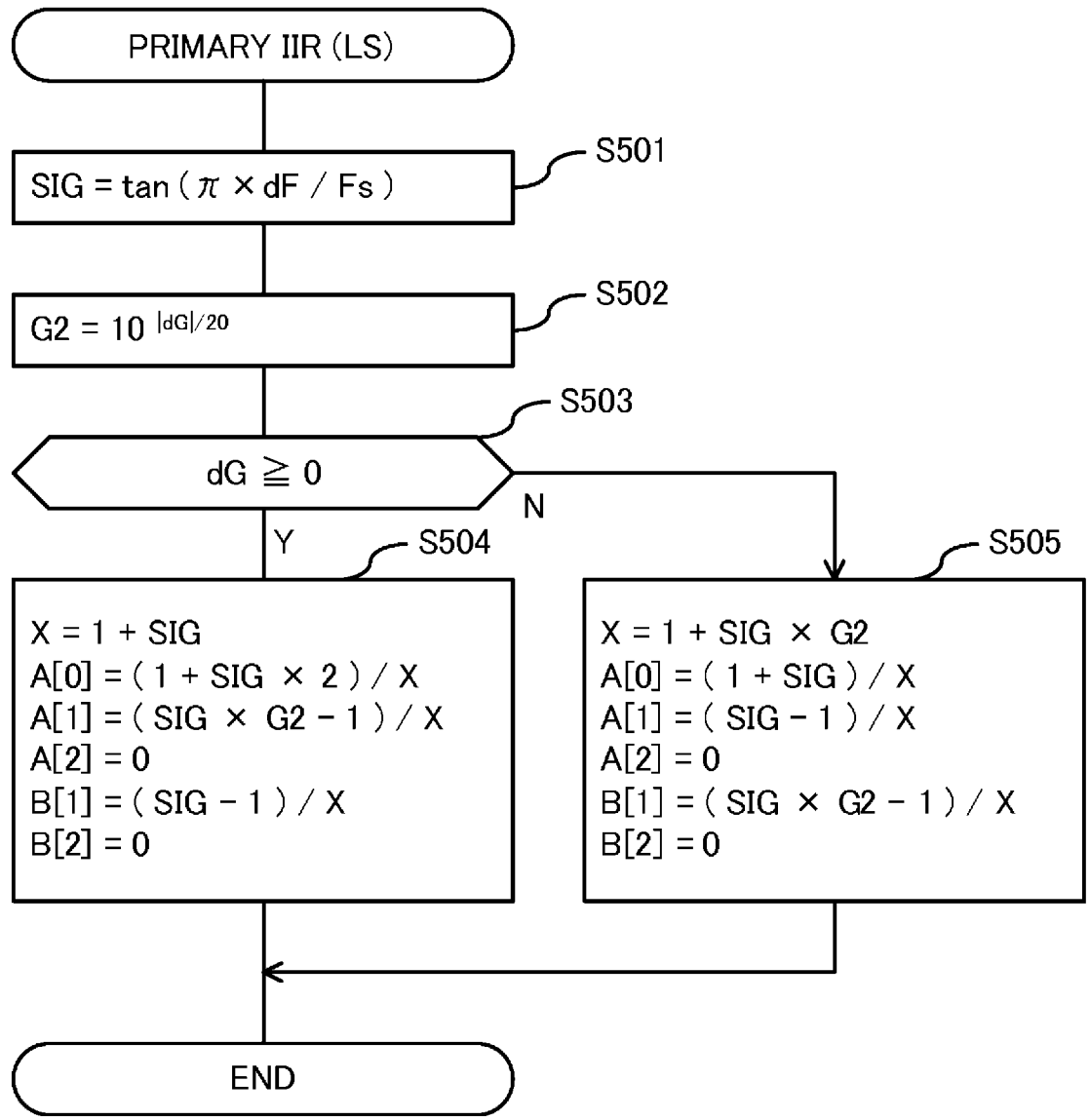
FIG. 5 is an exemplary flowchart of a coefficient calculating process of a 1st-order IIR low-shelf filter.

FIG. 5 is an exemplary flowchart of the coefficient calculating process of the 1st-order IIR low-shelf filter (S404). The coefficient calculating unit 30 calculates the value of a variable "SIG" according to "SIG=tan(π×dF×Fs)" based on the cut-off frequency (dF) and the sampling frequency (Fs) (S501). The coefficient calculating unit 30 calculates the value of a variable G2 according to $G2=10^{dGl/20}$ based on the gain (dG) (S502).

When the gain (dG) is positive (S503: Y), the coefficient calculating unit 30 calculates the filter coefficients A[0] to B[2] according to the following equations (S504).

$$X=1+SIG$$

$$A[0]=(1+SIG\times2)/X$$

$$A[1]=(SIG\times G2-1)/X$$

$$A[2]=0$$

$$B[1]=(SIG-1)/X$$

$$B[2]=0$$

When the gain (dG) is negative (S503: N), the coefficient calculating unit 30 calculates the filter coefficients A[0] to B[2] according to the following equations (S505).

$$X=1+SIG\times G2$$

$$A[0]=(1+SIG)/X$$

$$A[1]=(SIG-1)/X$$

$$A[2]=0$$

$$B[1]=(SIG\times G2-1)/X$$

$$B[2]=0$$

When the filter type (iType) is 0x01 (S403: 0x01), a coefficient calculating process (S405) to obtain a 1st-order IIR high-shelf filter is executed.

Figure 6:
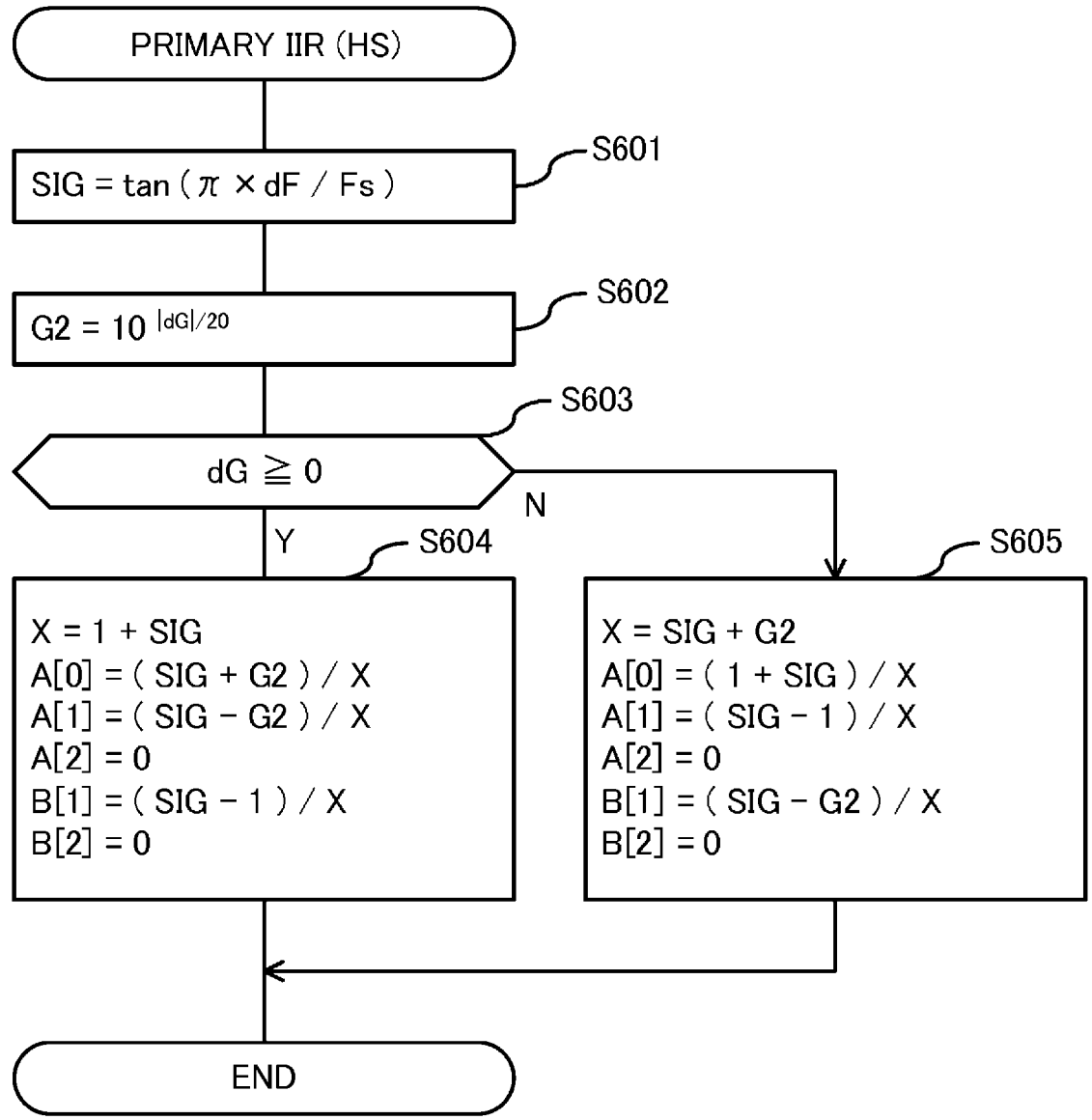
FIG. 6 is an exemplary flowchart of a coefficient calculating process of a 1st-order IIR high-shelf filter.

FIG. 6 is an exemplary flowchart of the coefficient calculating process (S405) of the 1st-order IIR high-shelf filter. The coefficient calculating unit 30 calculates the value of the variable SIG according to "SIG=tan(π×dF×Fs)" based on the cut-off frequency (dF) and the sampling frequency (Fs) (S601). The coefficient calculating unit 30 calculates the value of the variable G2 according to $G2=10^{dGl/20}$ based on the gain (dG) (S602).

When the gain (dG) is positive (S603: Y), the coefficient calculating unit 30 calculates the filter coefficients A[0] to B[2] according to the following equations (S604).

$$X=1+SIG$$

$$A[0]=(SIG+G2)/X$$

$$A[1]=(SIG-G2)/X$$

$$A[2]=0$$

$$B[1]=(SIG-1)/X$$

$$B[2]=0$$

When the gain (dG) is negative (S603: N), the coefficient calculating unit 30 calculates the filter coefficients A[0] to B[2] according to the following equations (S605).

$$X=SIG+G2$$

$$A[0]=(1+SIG)/X$$

$$A[1]=(SIG-1)/X$$

$$A[2]=0$$

$$B[1]=(SIG-G2)/X$$

$$B[2]=0$$

When the filter type (iTYpe) is 0x02 (S403: 0x02), a coefficient calculating process (S406) to obtain a 2nd-order IIR (secondary IIR) peaking filter is executed.

Figure 7:
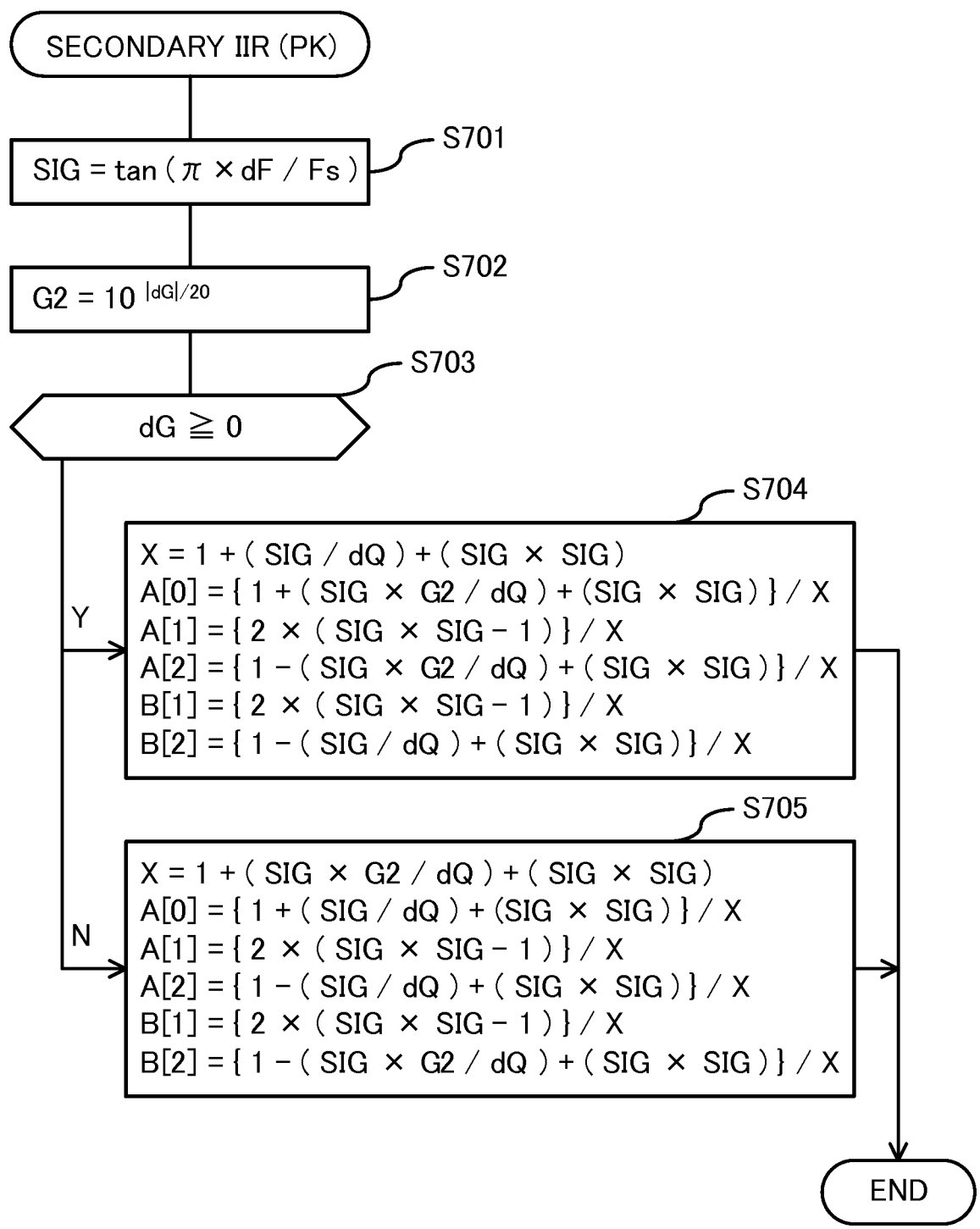
FIG. 7 is an exemplary flowchart of a coefficient calculating process of a 2nd-order IIR peaking filter.

FIG. 7 is an exemplary flowchart of the coefficient calculating process (S406) of the 2nd-order IIR peaking filter. The coefficient calculating unit 30 calculates the value of the variable SIG according to "SIG=tan(π×dF×Fs)" based on the cut-off frequency (dF) and the sampling frequency (Fs) (S701). The coefficient calculating unit 30 calculates the value of the variable G2 according to $G2=10^{dGl/20}$ based on the gain (dG) (S702).

When the gain (dG) is positive (S703: Y), the coefficient calculating unit 30 calculates the filter coefficients A[0] to B[2] according to the following equations (S704).

$$X=1+(SIG/dQ)+(SIG\times SIG)$$

$$A[0]=\{1+(SIG\times G2/dQ)+(SIG\times SIG)\}/X$$

$$A[1]=\{2\times(SIG\times SIG-1)\}/X$$

$$A[2]=\{1-(SIG\times G2/dQ)+(SIG\times SIG)\}/X$$

$$B[1]=\{2\times(SIG\times SIG-1)\}/X$$

$$B[2]=\{1-(SIG/dQ)+(SIG\times SIG)\}/X$$

When the gain (dG) is negative (S703: N), the coefficient calculating unit 30 calculates the filter coefficients A[0] to B[2] according to the following equations (S705).

$$X=1+(SIG \times G2/dQ)+(SIG \times SIG)$$

$$A[0]=\{1+(SIG/dQ)+(SIG \times SIG)\}/X$$

$$A[1]=\{2 \times (SIG \times SIG-1)\}/X$$

$$A[2]=\{1-(SIG/dQ)+(SIG \times SIG)\}/X$$

$$B[1]=\{2 \times (SIG \times SIG-1)\}/X$$

$$B[2]=\{1-(SIG \times G2/dQ)+(SIG \times SIG)\}/X$$

When the filter type (iThpe) is 0x03 (S403: 0x03), a coefficient calculating process (S407) to obtain a 1st-order IIR high-pass filter is executed.

Figure 8:
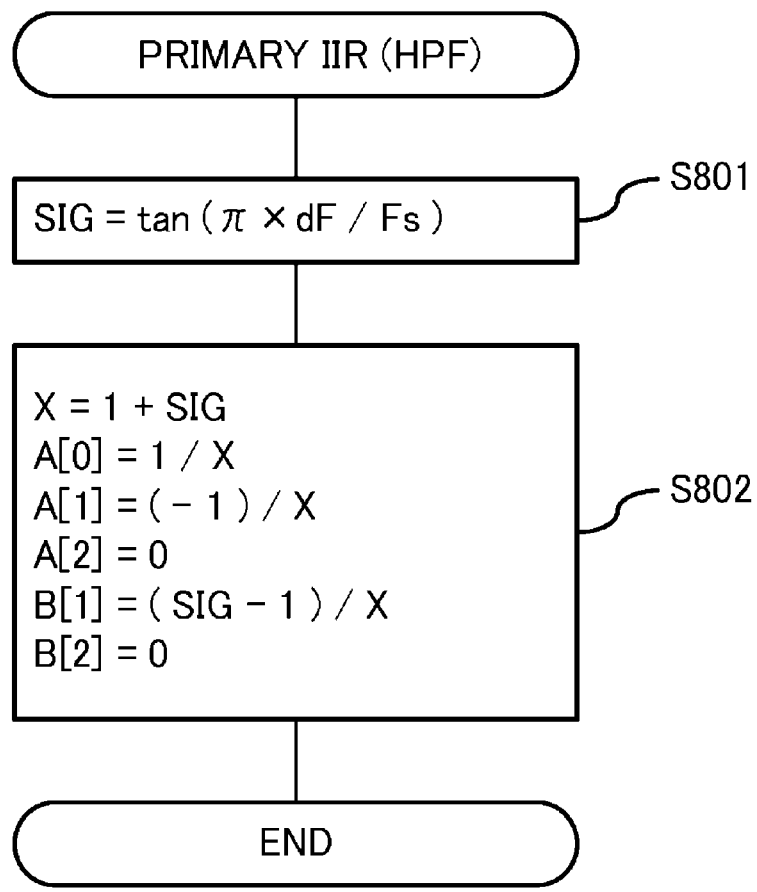
FIG. 8 is an exemplary flowchart of a coefficient calculating process of a 1st-order IIR high-pass filter.

FIG. 8 is an exemplary flowchart of the coefficient calculating process (S407) of the 1st-order IIR high-pass filter. The coefficient calculating unit 30 calculates the value of the variable SIG according to "SIG=tan(π×dF×Fs)" based on the cut-off frequency (dF) and the sampling frequency (Fs) (S801). The coefficient calculating unit 30 calculates the filter coefficients A[0] to B[2] according to the following equations (S802).

$$X=1+SIG$$

$$A[0]=1/X$$

$$A[1]=(-1)/X$$

$$A[2]=0$$

$$B[1]=(SIG-1)/X$$

$$B[2]=0$$

When the filter type (iType) is 0x04 (S403: 0x04), a coefficient calculating process (S408) to obtain a second IIR high-pass filter is executed.

Figure 9:
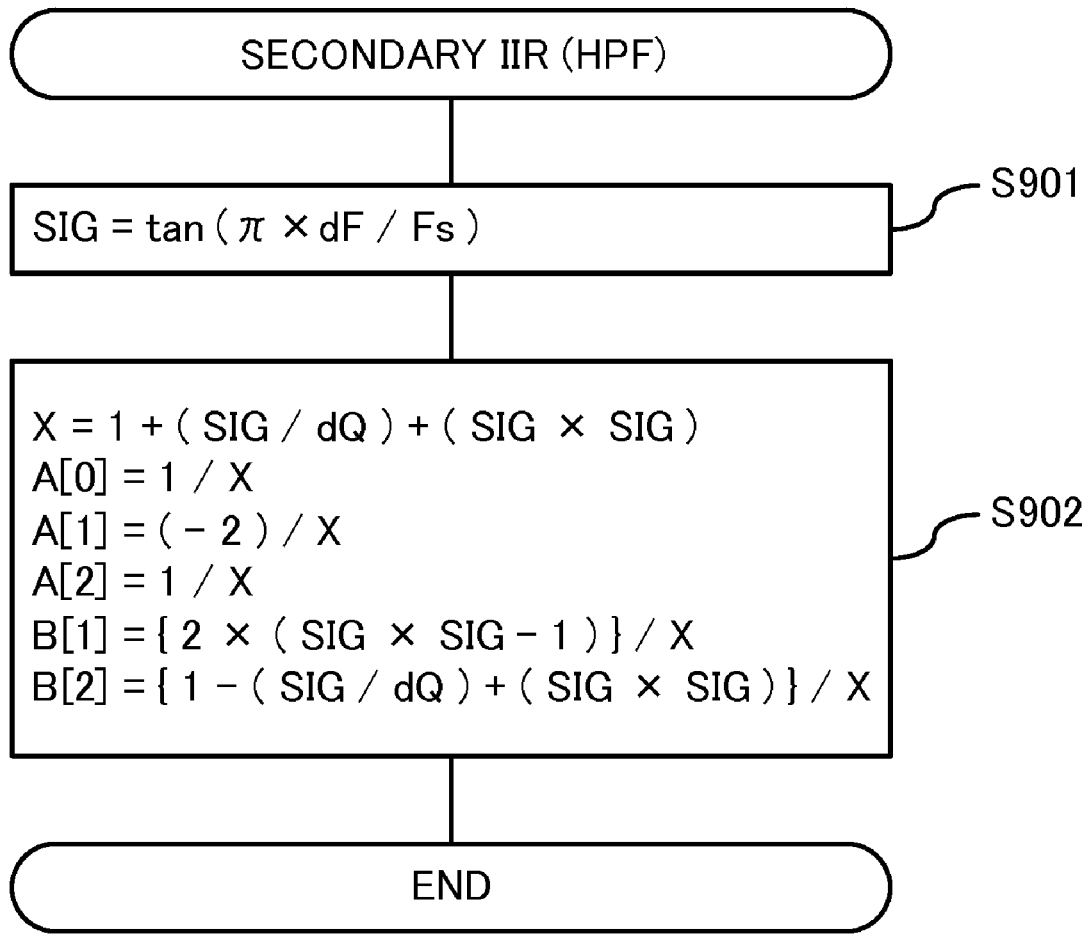
FIG. 9 is an exemplary flowchart of a coefficient calculating process of a 1st-order IIR high-pass filter.

FIG. 9 is an exemplary flowchart of the coefficient calculating process (S408) of the 2nd-order IIR high-pass filter. The coefficient calculating unit 30 calculates the value of the variable SIG according to "SIG=tan(π×dF×Fs)" based on the cut-off frequency (dF) and the sampling frequency (Fs) (S901). The coefficient calculating unit 30 calculates the filter coefficients A[0] to B[2] according to the following equations (S902).

$$X=1+(SIG/dQ)+(SIG \times SIG)$$

$$A[0]=1/X$$

$$A[1]=(-2)/X$$

$$A[2]=1/X$$

$$B[1]=\{2 \times (SIG \times SIG-1)\}/X$$

$$B[2]=\{1-(SIG/dQ)+(SIG \times SIG)\}/X$$

When the filter type (iType) is 0x05 (S403: 0x05), a coefficient calculating process (S409) to obtain a 1st-order IIR low-pass filter is executed.

Figure 10:
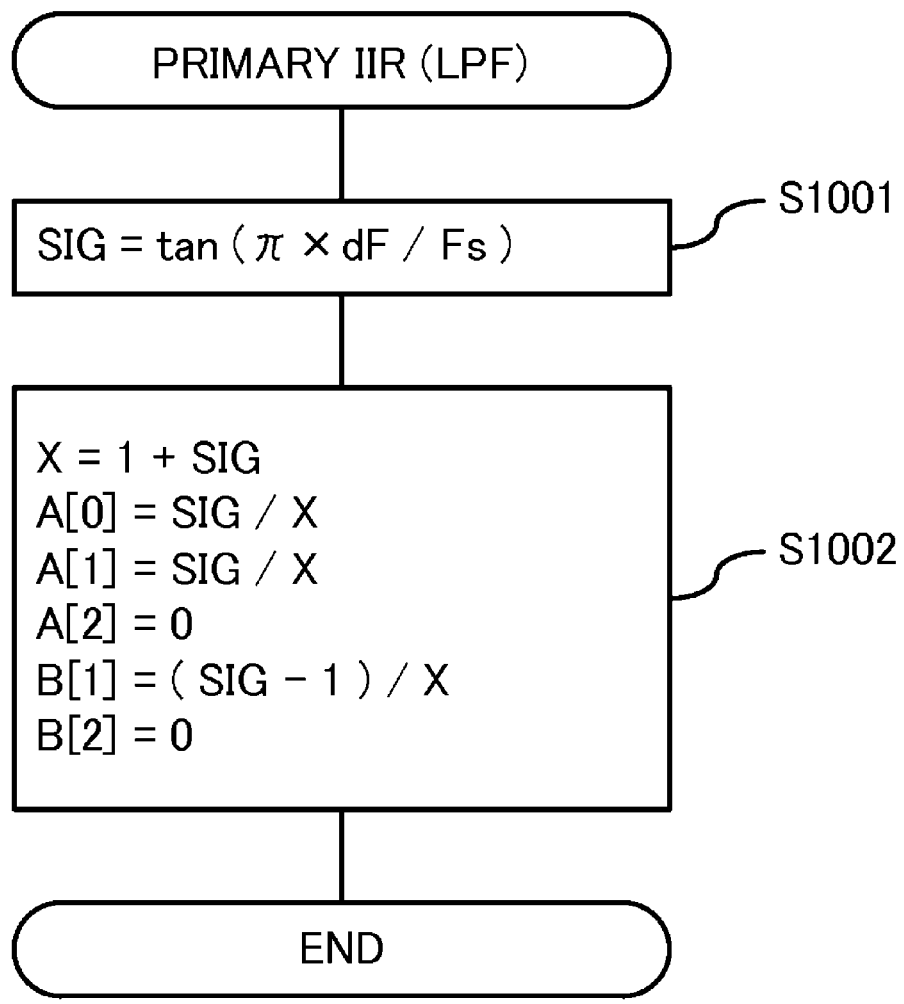
FIG. 10 is an exemplary flowchart of a coefficient calculating process of a 1st-order IIR low-pass filter.

FIG. 10 is an exemplary flowchart of the coefficient calculating process (S409) of the 1st-order IIR low-pass filter. The coefficient calculating unit 30 calculates the value of the variable SIG according to "SIG=tan(π×dF×Fs)" based on the cut-off frequency (dF) and the sampling frequency (Fs) (S1001). The coefficient calculating unit 30 calculates the filter coefficients A[0] to B[2] according to the following equations (S1002).

$$X=1+SIG$$

$$A[0]=SIG/X$$

$$A[1]=SIG/X$$

$$A[2]=0$$

$$B[1]=(SIG-1)/X$$

$$B[2]=0$$

When the filter type (iType) is 0x06 (S403: 0x06), a coefficient calculating process (S410) to obtain a 2nd-order IIR low-pass filter is executed.

Figure 11:
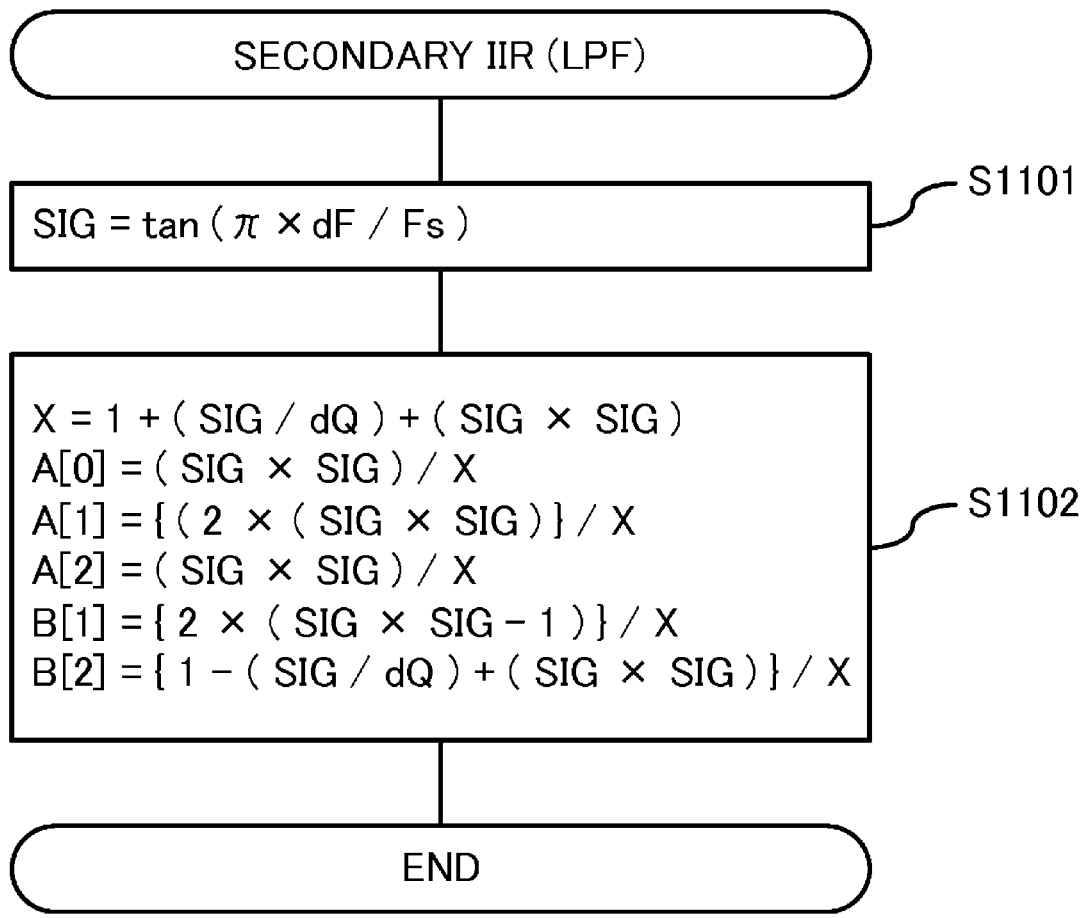
FIG. 11 is an exemplary flowchart of a coefficient calculating process of a 2nd-order IIR low-pass filter.

FIG. 11 is an exemplary flowchart of the coefficient calculating process (S410) of the 2nd-order IIR low-pass filter. The coefficient calculating unit 30 calculates the value of the variable SIG according to "SIG=tan(π×dF×Fs)" based on the cut-off frequency (dF) and the sampling frequency (Fs) (S1101). The coefficient calculating unit 30 calculates the filter coefficients A[0] to B[2] according to the following equations (S1102).

$$X=1+(SIG/dQ)+(SIG \times SIG)$$

$$A[0]=(SIG \times SIG)/X$$

$$A[1]=\{(2 \times (SIG \times SIG)\}/X$$

$$A[2]=(SIG \times SIG)/X$$

$$B[1]=\{2 \times (SIG \times SIG-1)\}/X$$

$$B[2]=\{1-(SIG/dQ)+(SIG \times SIG)\}/X$$

Figure 12:
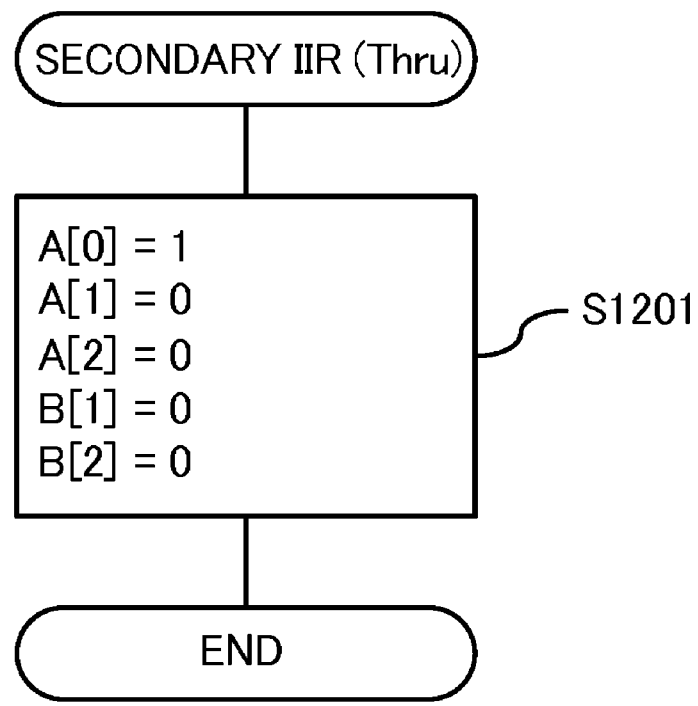
FIG. 12 is an exemplary flowchart of a coefficient calculating process executed when an input signal is outputted without being processed.

When the filter type (iType) is 0x07 (S403: 0x07), a coefficient calculating process (S411) to obtain a filter that outputs an inputted signal without applying any processing thereto (passes through) is executed. FIG. 12 is an exemplary flowchart of the coefficient calculating process (S411) for a filter that outputs an inputted signal without applying any processing thereto. In this case, the coefficient calculating unit 30 sets the filter coefficient A[0] to be one and other filter coefficients A[1] to B[2] to be respectively zero.

Figure 13:
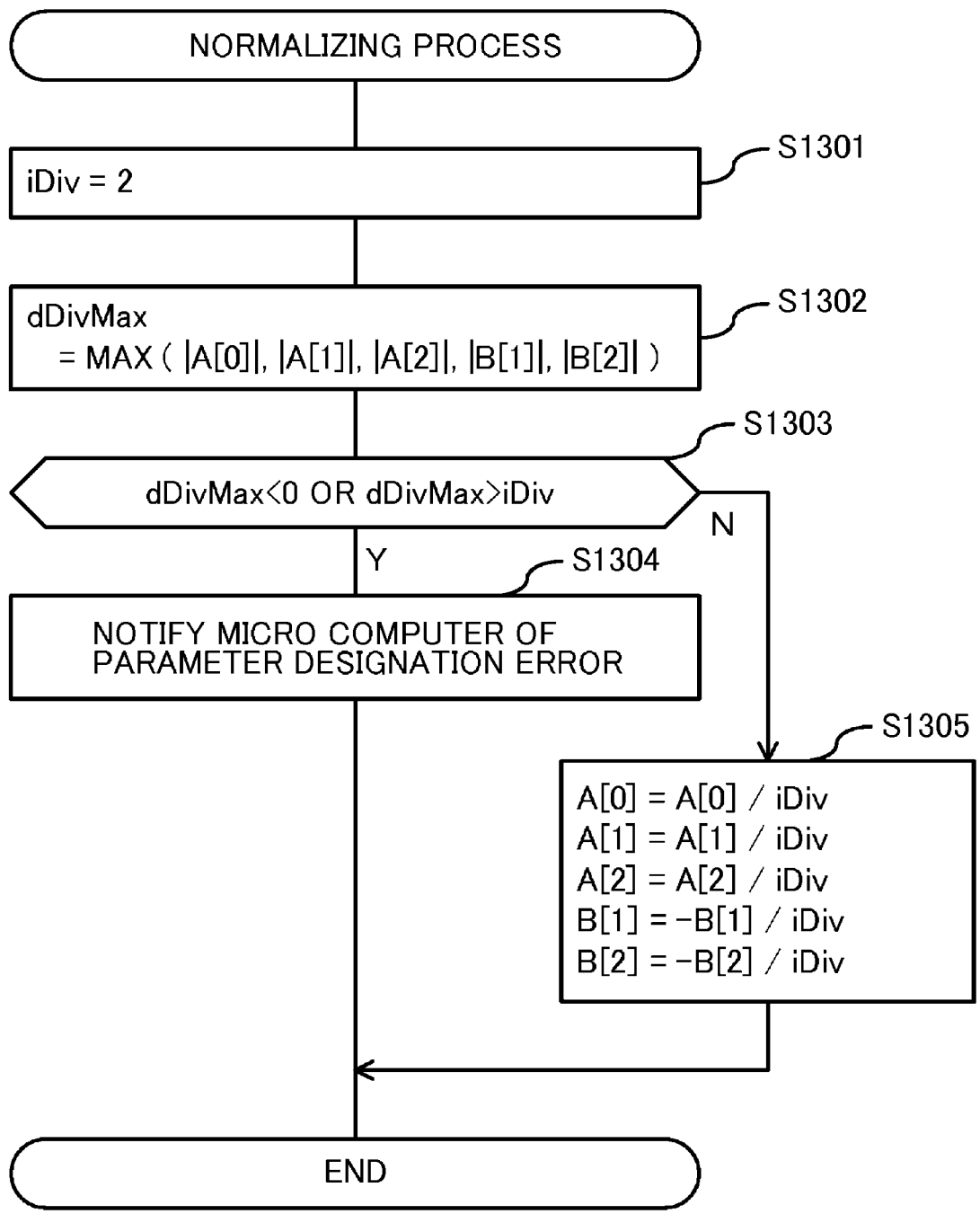
FIG. 13 is an exemplary flowchart of a normalizing process of a filter coefficient.

Description will be given for a normalizing process of filter coefficients. FIG. 13 is an exemplary flowchart of the normalizing process of the filter coefficients. The coefficient calculating unit 30 sets a predetermined value ("two" in the embodiment) as a variable "iDiv" that represents the shift amount (S1301). The value of the variable iDiv represents a value that divides the filter coefficients. For example, when the variable iDiv is two, the filter coefficients each are divided by two and, in this case, the filter coefficients are shifted to the right by one bit. Not only two but also a value that is $2^N$ such as one, four, and eight corresponding to the shift amount can be set as the variable iDiv. The coefficient calculating unit 30 sets the maximum of absolute values of the filter coefficients A[0] to B[2] as a variable dDivMax (S1302). The coefficient calculating unit 30 checks whether the variable dDivMax is smaller than zero or the variable dDivMax is larger than the variable iDiv (S1303). That is, the coefficient calculating unit 30 checks whether the results of dividing the filter coefficients A[0] to B[2] by the variable iDiv are within a range from −1 to 1. When the variable dDivMax is smaller than zero or larger than the variable iDiv (S1303: Y), the coefficient calculating unit 30 notifies the external microcomputer 16 of a parameter designation error (calculation error signal) (S1304). On the other hand, when the variable dDivMax is equal to or larger than zero and equal to or smaller than the variable iDiv (S1303: N), the coefficient calculating unit 30 normalizes the filter coefficients A[0] to B[2] according to the following equations (S1305). Assuming that iDiv=$2^N$, the division by the variable iDiv is realized by shifting to the right by N bits.

$A[0]=A[0]/iDiv$ $A[1]=A[1]/iDiv$ $A[2]=A[2]/iDiv$ $B[1]=-B[1]/iDiv$ $B[2]=-B[2]/iDiv$

Other Configurations

Figure 14:
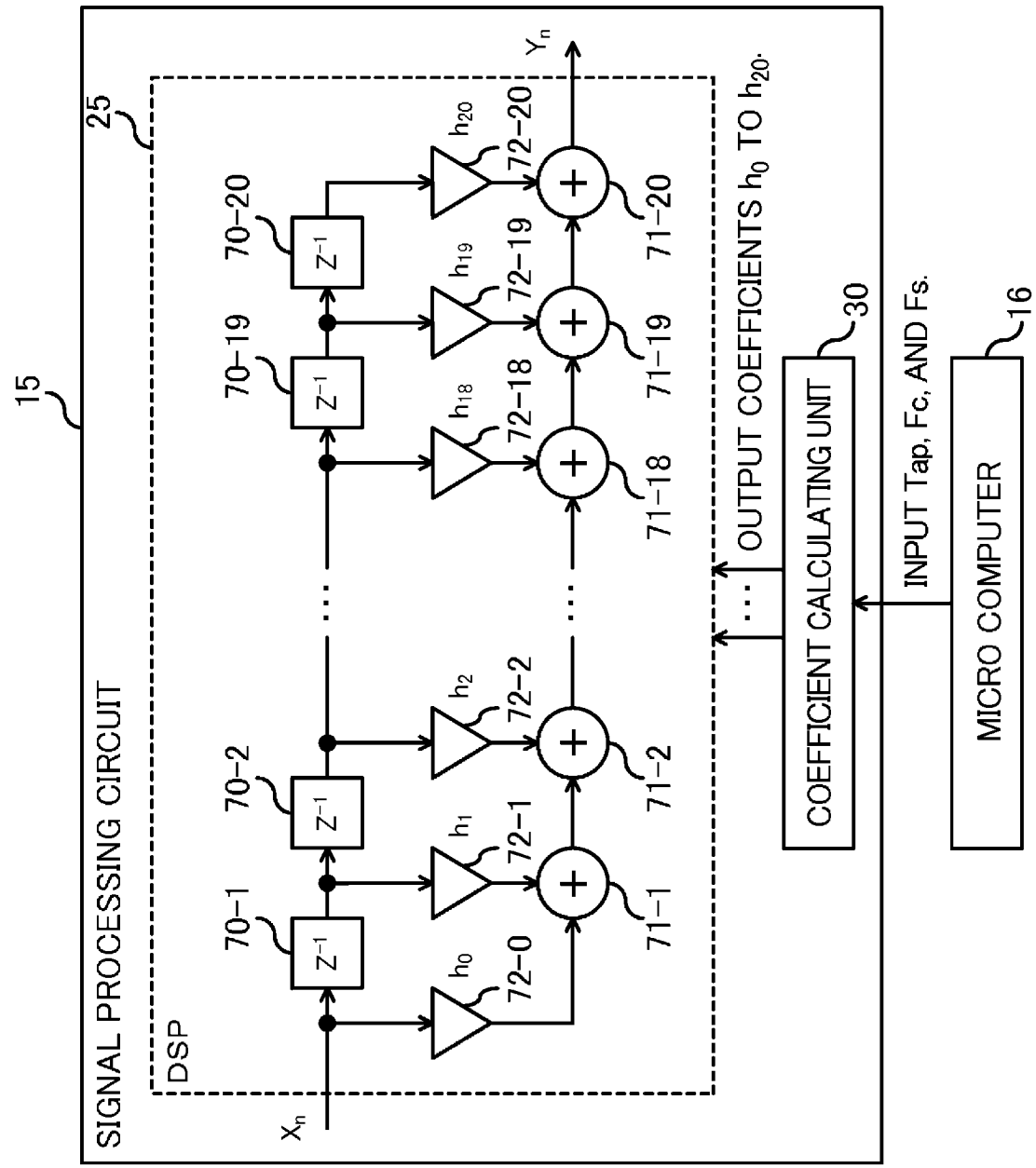
FIG. 14 is a block diagram of an exemplary concept of an FIR filter realized by the DSP.
Figure 15:
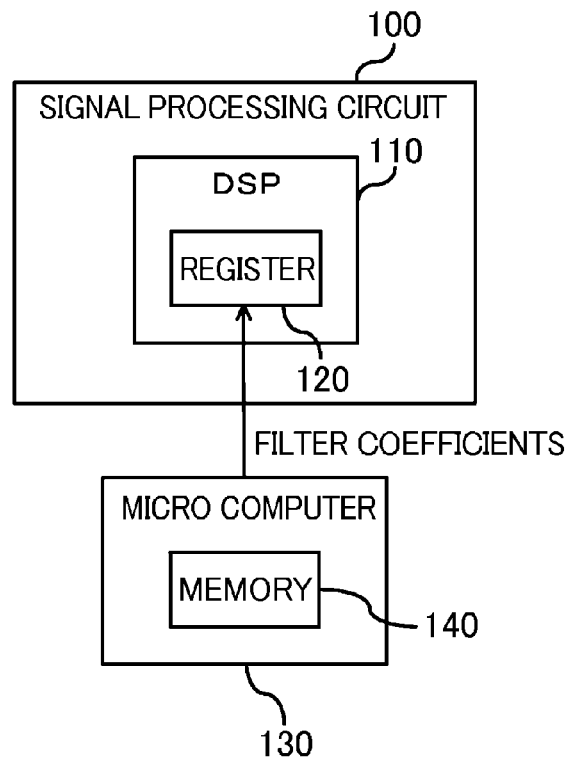
FIG. 15 is a diagram of a portion of a system configured using the signal processing circuit.
Figure 16:
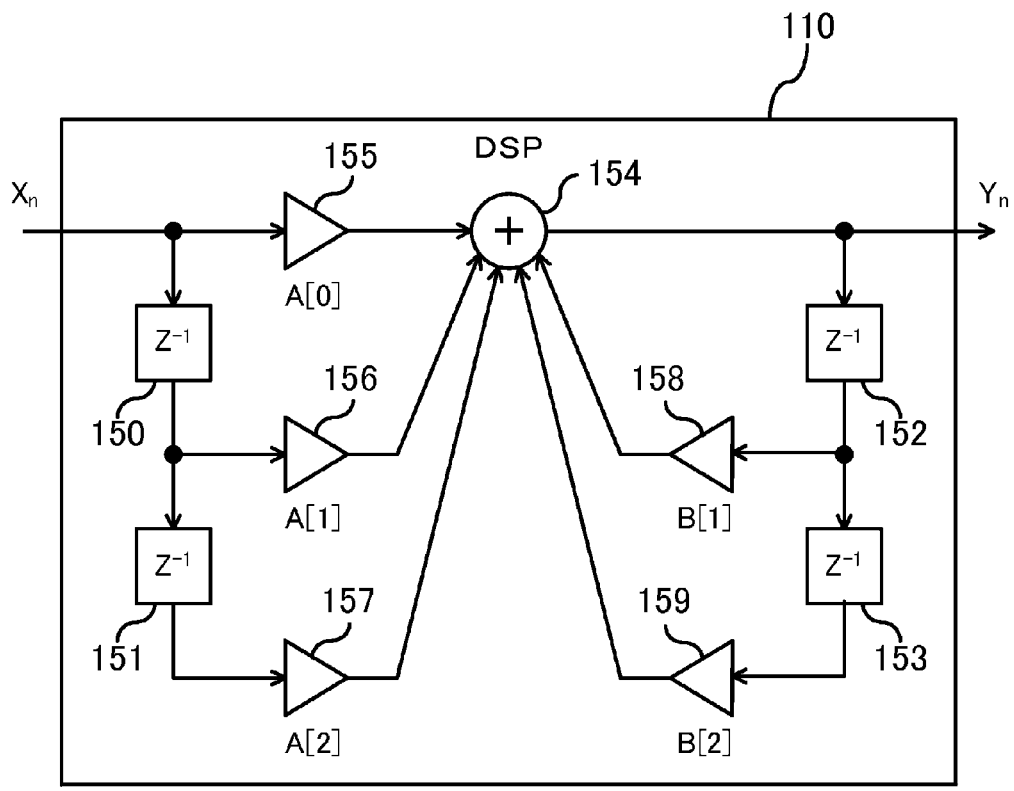
FIG. 16 is a block diagram of an exemplary concept of the 2nd-order IIR filter.

The filter realized by the DSP 25 is not only limited to an IIR filter but also may be a filter having another configuration such as an FIR filter. FIG. 14 is a block diagram of an exemplary concept of an FIR filter realized by the DSP 25. As shown in FIG. 14, the FIR filter is configured by delaying units 70-1 to 70-20, adding units 71-1 to 71-20, and multiplying units 72-0 to 72-20.

The microcomputer 16 outputs tap number information (Tap), the frequency information (Fc), and the sampling frequency information (Fs) as the controlling data to determine the filter characteristic of the FIR filter, through a system bus etc. to the coefficient calculating unit 30. The tap number information is information to identify the number of taps, that is, the number of stages of the delaying units in the FIR filter.

For example, the coefficient calculating unit 30 calculates filter coefficients h0 to h20 and stores the calculated filter coefficients into the register 41 to obtain a low-pass filter having a characteristic indicated by the controlling data based on the FIR filter. For example, when the tap number is 20, the cut-off frequency is 3 KHz, and the sampling frequency is 44.1 KHz, the coefficient calculating unit 30 can calculate the filter coefficients h0 to h20 based on fir1 (20, 3,000/(44,100/2)) using a function fir1 of MATLAB (a registered trademark).

As above, an embodiment of the present invention has been described. As described, the signal processing circuit 15 calculates the filter coefficients based on the frequency information inputted from the external microcomputer 16. Therefore, the characteristic frequency of an output signal in the filtering process can be varied with the controlling data having the data amount that is less than that of the filter coefficients used when the filter coefficients themselves are inputted from the microcomputer 16. Thereby, the communication traffic on a system bus etc. can be reduced and the influence on the processing performance of the system can be suppressed. The filter coefficients need not be stored in the microcomputer 16 and, therefore, increase of the memory capacity of the microcomputer 16 can be suppressed.

The signal processing circuit 15 further receives at least any one of the sampling frequency information, the gain information, and the selectivity information from the microcomputer 16 in addition to the frequency information, and can also calculate the filter coefficients based on the frequency information and the received piece(s) of information of the sampling frequency information, the gain information, and the selectivity information. That is, the signal processing circuit 15 can vary the characteristic frequency, the sampling frequency, the gain, and the selectivity of the output signal in the filtering process, with the controlling data having the data amount that is less than that of the filter coefficients.

The signal processing circuit 15 further can calculate the filter coefficients corresponding to the type of the filter by receiving the filter type information. That is, the signal processing circuit 15 can change the type of the filter (such as a high-pass filter and a low-pass filter) with the controlling data having the data amount that is less than that of the filter coefficients.

For example, in the case where the precision of the filter coefficients A[0] to B[2] for a 2nd-order IIR filter is three bytes (24 bits), when the filter coefficients themselves are transmitted from the microcomputer 16 to the signal processing circuit 15, transmitted data is 15 bytes. On the other hand, when the controlling data has a configuration shown in FIG. 2, data transmitted from the microcomputer 16 to the signal processing unit 15 is five bytes and the data amount is reduced to one third of that for the case where the filter coefficients themselves are transmitted.

The signal processing circuit 15 executes the right-shifting process of the filter coefficients such that the filter coefficients A[0] to B[2] each take values within the predetermined range (−1 to 1). Thereby, the filter coefficients can be handled as decimal fractions in the fixed point mode. That is, the shifted filter coefficients can be applied to a circuit that executes calculation of decimal fractions by the fixed point mode calculation.

When the filter coefficients are not values within the predetermined range (−1 to 1) even after shifting the filter coefficients to the right by predetermined bits, the signal processing circuit 15 notifies the microcomputer 16 of the parameter designation error. Though the filter coefficients can be adjusted to include values within the predetermined range by increasing the right-shift amount corresponding to the value of the filter coefficients, the precision thereof is degraded when the shift amount is too large. Therefore, as shown in the embodiment, the shift amount is fixed and, when the filter coefficients after being shifted are not values within the predetermined range (−1 to 1), an error is determined to have occurred. Thereby, the degradation of the precision of the filter coefficients can be suppressed.

The above embodiments of the present invention are simply for facilitating the understanding of the present invention and are not in any way to be construed as limiting the present invention. The present invention may variously be changed or altered without departing from its spirit and encompass equivalents thereof.

It is claimed:

1. A filtering integrated circuit comprising:
   a storing circuit;
   a filter coefficient calculating unit configured to receive frequency information that identifies a characteristic frequency of an output signal in a filtering process, and to calculate filter coefficients based on the frequency information, the filter coefficient calculating unit further configured to set the filter coefficients in the storing circuit after shifting the calculated filter coefficients to the right by N bits such that the filter coefficients become values within a predetermined range; and
   a filtering unit configured to output the output signal after applying a filtering process to an inputted signal based on the filter coefficients set in the storing circuit, the filtering unit further configured to output the output signal after shifting the output signal to the left by N bits.

2. The filtering integrated circuit of claim 1, wherein
   the filter coefficient calculating unit is configured to
      receive further at least one of: sampling frequency information that identifies a sampling frequency in a filtering process; gain information that identifies the gain of the output signal; and selectivity information that identifies the selectivity of the output signal, and calculate the filter coefficients based on the frequency information and on the received information out of the sampling frequency information, the gain information, and the selectivity information.

3. The filtering integrated circuit of claim 2, wherein the filter coefficient calculating unit is configured to output a filter coefficient calculation error signal when the shifted filter coefficients are not values within the predetermined range.

4. The filtering integrated circuit of claim 2, wherein the filter coefficient calculating unit is configured to receive further filter type information that identifies the type of the filter process, and calculate the filter coefficients based on the filter type information and the frequency information and on the received information out of the sampling frequency information, the gain information, and the selectivity information.

5. The filtering integrated circuit of claim 4, wherein the filter coefficient calculating unit is configured to output a filter coefficient calculation error signal when the shifted filter coefficients are not values within the predetermined range.

6. The filtering integrated circuit of claim 1, wherein the filter coefficient calculating unit is configured to output a filter coefficient calculation error signal when the shifted filter coefficients are not values within the predetermined range.

* * * * *